US006768138B1

(12) United States Patent
Kitada et al.

(10) Patent No.: US 6,768,138 B1
(45) Date of Patent: Jul. 27, 2004

(54) DIODE ELEMENT

(75) Inventors: Mizue Kitada, Hanno (JP); Kosuke Ohsima, Hanno (JP); Shinji Kunori, Hanno (JP)

(73) Assignee: Shindengen Electric Manufacturing Co., Ltd., Tokyo (JP)

(*) Notice: Subject to any disclaimer, the term of this patent is extended or adjusted under 35 U.S.C. 154(b) by 0 days.

(21) Appl. No.: 10/367,858

(22) Filed: Feb. 19, 2003

(30) Foreign Application Priority Data

Feb. 20, 2002 (JP) ........................................ 2002-042535

(51) Int. Cl.$^7$ ............................................ H01L 29/74
(52) U.S. Cl. ..................... 257/127; 257/104; 257/106; 257/199; 257/471; 257/481; 257/603
(58) Field of Search ................................ 257/104, 106, 257/127, 199, 471, 481–2, 551, 603–605

(56) References Cited

U.S. PATENT DOCUMENTS

| 3,335,296 A | 8/1967 | Smart .................... 307/88.5 |
| 3,391,287 A | 7/1968 | Kao et al. ................ 307/0.302 |
| 3,541,403 A | 11/1970 | Lepselter et al. ........... 317/234 |
| 4,754,310 A | 6/1988 | Coe ......................... 357/13 |
| 5,081,509 A * | 1/1992 | Kozaka et al. ............. 257/106 |
| 5,216,275 A | 6/1993 | Chen ...................... 257/493 |
| 5,241,195 A | 8/1993 | Tu et al. .................. 257/155 |
| 6,184,545 B1 * | 2/2001 | Werner et al. ............. 257/109 |
| 6,204,097 B1 | 3/2001 | Shen et al. ................ 438/133 |
| 6,404,032 B1 | 6/2002 | Kitada et al. .............. 257/471 |
| 2001/0052617 A1 | 12/2001 | Kitada et al. .............. 257/331 |
| 2003/0042555 A1 | 3/2003 | Kitada et al. .............. 257/401 |

FOREIGN PATENT DOCUMENTS

| EP | 1 130 653 A2 | 9/2001 |
| EP | 1 139 433 A1 | 10/2001 |
| EP | 1 289 022 A2 | 3/2003 |
| JP | 2001-244462 | 9/2001 |
| JP | 2001-284604 | 10/2001 |
| JP | 2003-69017 | 3/2003 |

* cited by examiner

*Primary Examiner*—Long Pham
*Assistant Examiner*—Wai-Sing Louie
(74) *Attorney, Agent, or Firm*—Armstrong, Kratz, Quintos, Hanson & Brooks, LLP.

(57) ABSTRACT

The invention relates to technology improving the withstand voltage of a Schottky diode. With a diode of the present invention, the distance a between the long sides of the narrow groove withstand voltage portions and the inner ring circumference of the intermediate withstand voltage portion is set to twice the distance b between the short sides of the narrow groove withstand voltage portions and the inner ring circumference of the intermediate withstand voltage portion. Furthermore, the distance c between the inner ring circumference of the innermost outer withstand voltage portions and the outer ring circumference of the intermediate withstand voltage portion, the distance u between the adjacent outer withstand voltage portions, and the distance d between the adjacent narrow groove withstand voltage portions are all equal to the distance a. Also, the ring width w of the outer withstand voltage portions and the intermediate withstand voltage portion as well as the width y of the narrow groove withstand voltage portions are the same. Thus, the entire inner side of the outermost outer withstand voltage portion becomes depleted, and there are no local concentrations of the electric field at the portions located on the inner side of the outermost outer withstand voltage portion, so that the withstand voltage is improved in comparison to a conventional element.

6 Claims, 11 Drawing Sheets

Fig. 17
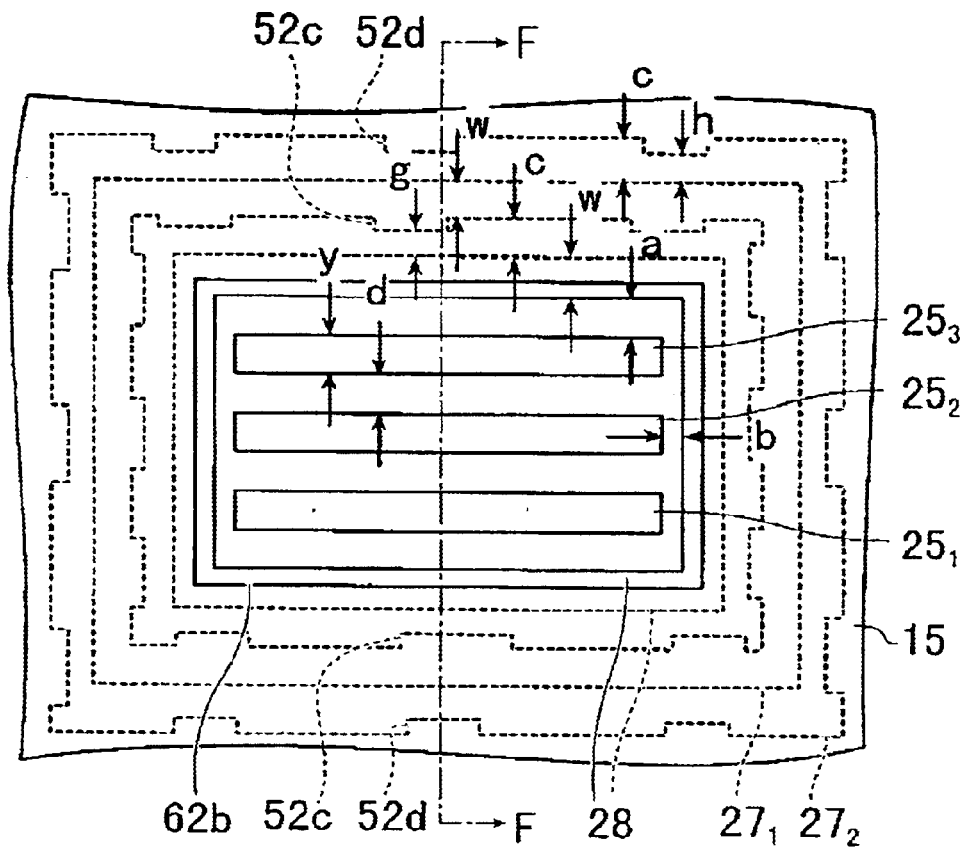
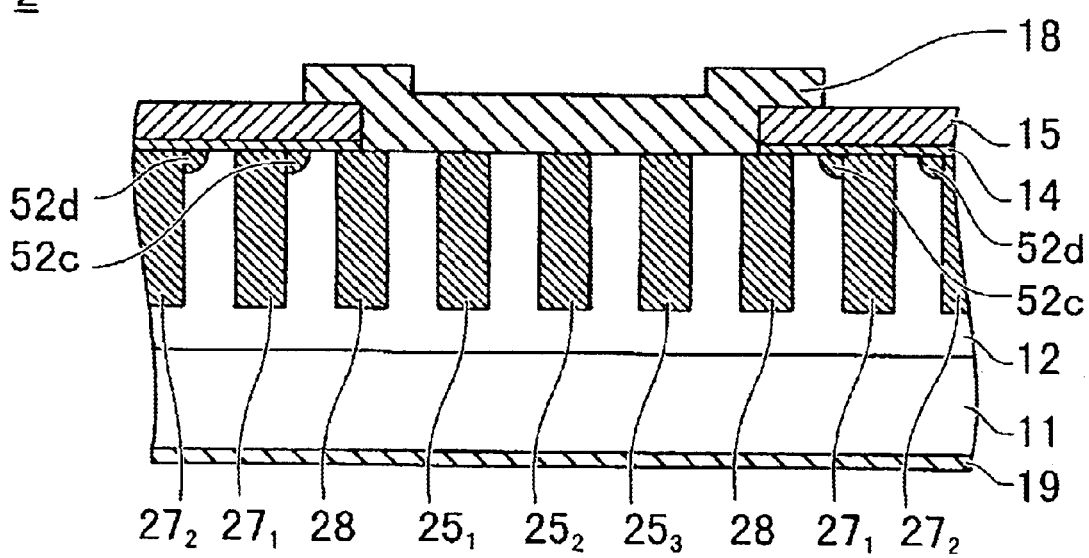
Fig. 18

Fig. 19
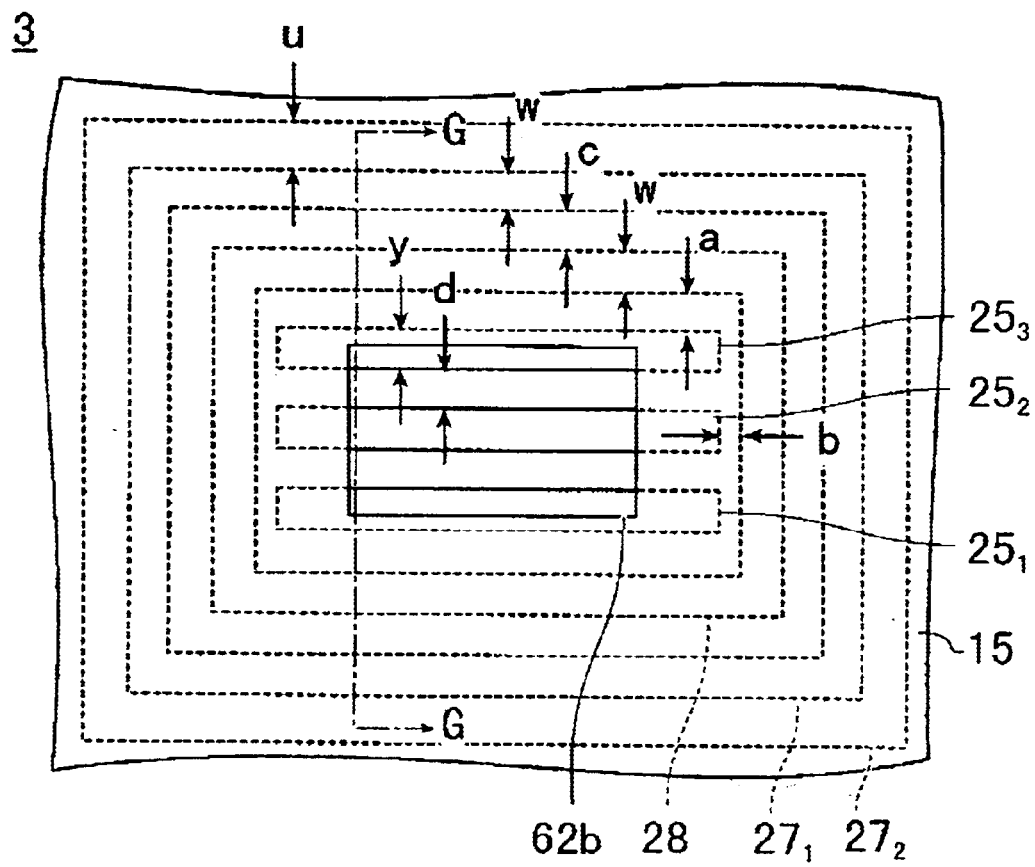
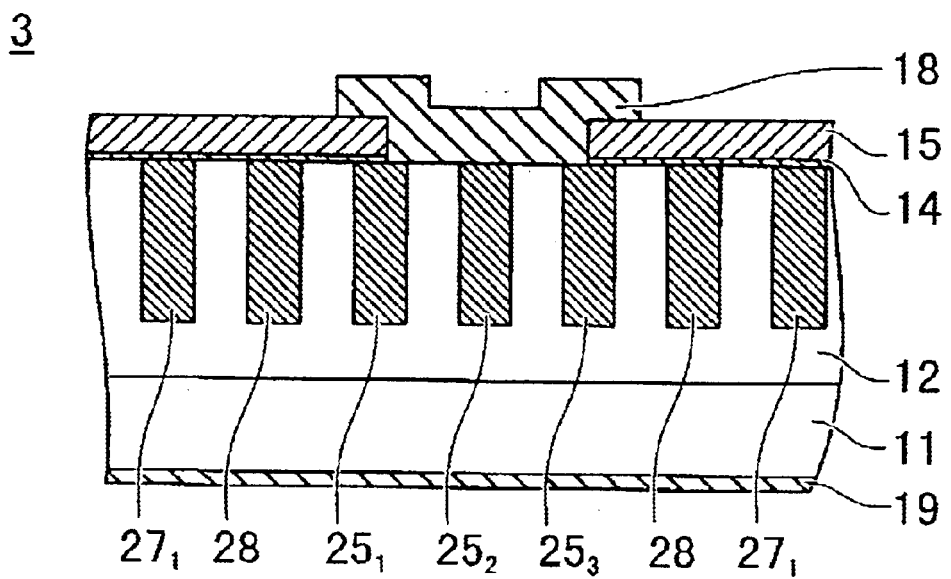
Fig. 20

Fig. 21 PRIOR ART
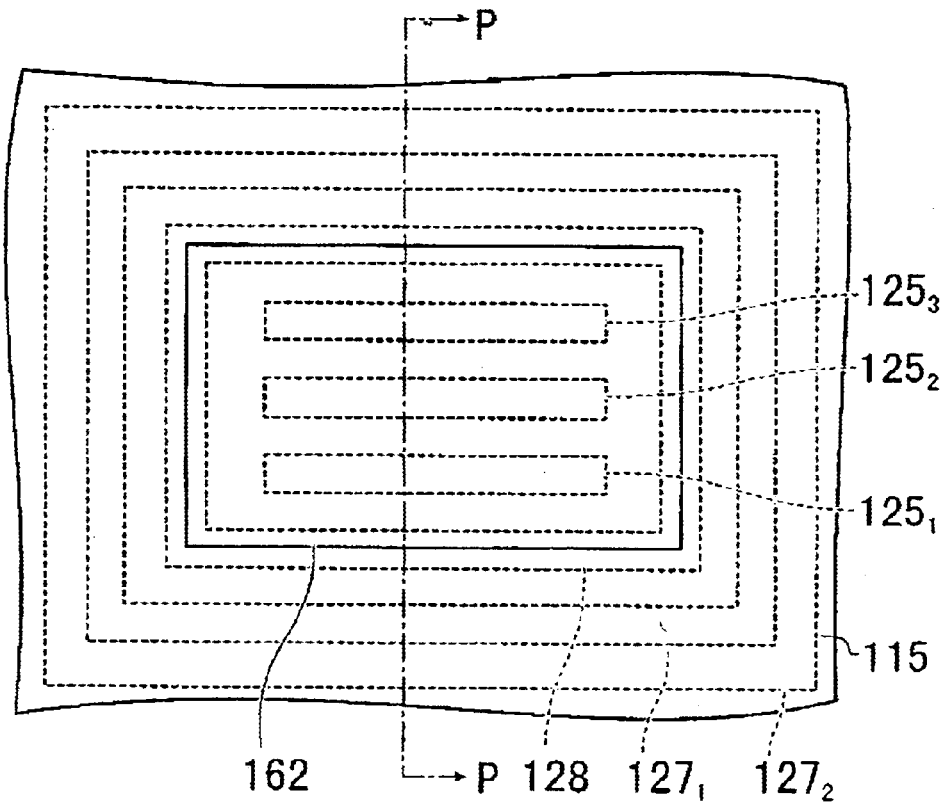
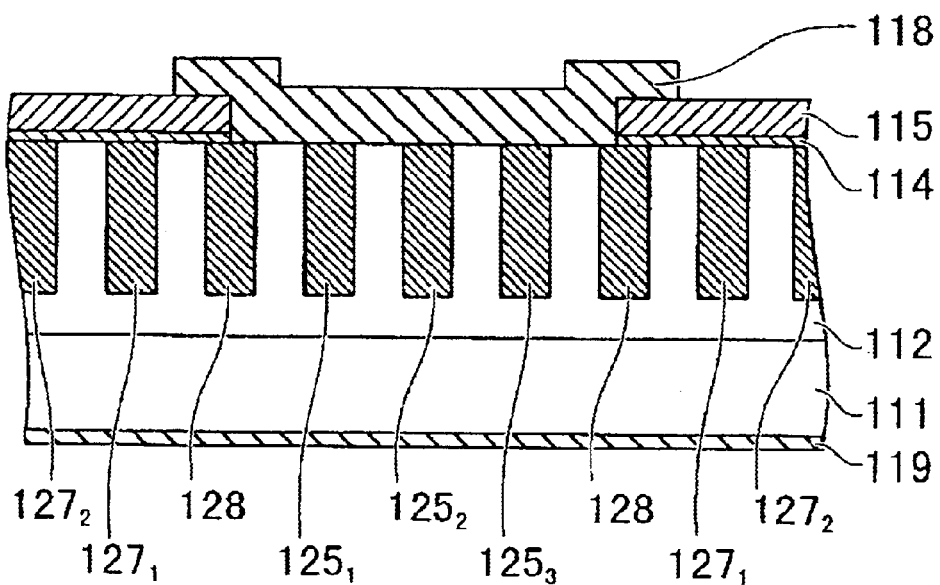
Fig. 22 PRIOR ART

DIODE ELEMENT

FIELD OF THE INVENTION

The present invention relates to diodes, and more particularly to diodes having a structure, in which a semiconductor crystal has been epitaxially grown in narrow grooves.

BACKGROUND OF THE INVENTION

FIG. 21 is a plan view of a conventional diode 101, and FIG. 22 is a cross-sectional view taken along the line P—P in FIG. 21.

This diode 101 includes an N-type silicon substrate 111. An N-type epitaxial layer 112 is formed on the surface of the silicon substrate 111.

The grooves whose planar shape is that of a rectangular ring surface are provided on the surface of the epitaxial layer 112. In the case shown, three rectangular ring-shaped grooves are provided, and these ring-shaped grooves are arranged concentrically. The ring-shaped grooves are each filled with a semiconductor layer containing P-type impurities and formed by epitaxial growth.

The innermost of these rectangular ring-shaped semiconductor layers is an intermediate withstand voltage portion 128. Two outer withstand voltage portions $127_1$ and $127_2$ are arranged concentrically on the outside this intermediate withstand voltage portion 128. A plurality of narrow grooves with a rectangular planar shape are arranged on the inner side of the intermediate withstand voltage portion 128. These narrow grooves are arranged parallel to one another. The narrow grooves are filled with narrow groove withstand voltage portions $125_1$ to $125_3$ made of semiconductor layers containing P-type impurities and formed by epitaxial growth.

A thermal oxide film 114 and a PSG (Phospho-Silicate glass) film 115 are formed in that order on the surface of the epitaxial layer 112. An anode electrode 118 made of a metal thin film is disposed on the PSG film 115. An opening is formed in the thermal oxide film 114 and the PSG film 115 at the same position. The epitaxial layer 112, the narrow groove withstand voltage portions $125_1$ to $125_3$ and the intermediate withstand voltage portion 128 are exposed at the bottom of this opening and are in contact with the anode electrode 118.

The anode electrode 118 is a metal thin film forming a Schottky junction with the epitaxial layer 112 and forming an ohmic junction with the narrow groove withstand voltage portions $125_1$ to $125_3$ and the intermediate withstand voltage portion 128.

When a positive voltage is applied to the anode electrode 118 and a negative voltage is applied to the cathode electrode 119 of the diode 101 with this structure, then the Schottky junction between the anode electrode 118 and the epitaxial layer 112 is forward biased, and a current flows from the anode electrode 118 to the cathode electrode 119.

When, conversely, a negative voltage is applied to the anode electrode 118 and a positive voltage is applied to the cathode electrode 119, then the Schottky junction between the anode electrode 118 and the epitaxial layer 112 and the PN junctions between the narrow groove withstand voltage portions $125_1$ to $125_3$ and the intermediate withstand voltage portion 128 and the epitaxial layer 112 are reverse biased, and no current flows. In this situation, a depletion layer spreads from the PN junctions in the lateral direction in the epitaxial layer 112.

Conventionally, the widths and spacings between the narrow groove withstand voltage portions $125_1$ to $125_3$, the intermediate withstand voltage portion 128 and the outer withstand voltage portions $127_1$ and $127_2$ were not set with withstand voltage in mind, so that even when the epitaxial layer 112 is depleted between the long side of the narrow groove withstand voltage portions $125_1$ to $125_3$ and the inner ring circumference of the intermediate withstand voltage portion 128, the epitaxial layer 112 was not necessarily depleted between the short side of the narrow groove withstand voltage portions $125_1$ to $125_3$ and the inner ring circumference of the intermediate withstand voltage portion 128. Thus, electric fields concentrated at the locations where no depletion layer is formed, and the withstand voltage was decreased.

It is thus an object of the present invention to overcome these problems of the related art and to provide a diode element with high withstand voltage.

SUMMARY OF THE INVENTION

In order to attain the above-described object, in a first aspect of the present invention, a diode element includes a substrate of a first conductivity type, a plurality of grooves formed in a main surface of the substrate, a semiconductor filler that is made of a semiconductor of a second conductivity type, which is opposite to the first conductivity type, filled into the grooves, and an electrode film arranged on the main surface, wherein a Schottky junction is formed at a portion where the electrode film contacts the surface of the substrate, and an ohmic junction is formed at a portion where the electrode film contacts the surface of the semiconductor filler, wherein the grooves comprise a first narrow groove ring, whose planar shape is a ring and whose inner circumference is quadrilateral, and a plurality of rectangular narrow grooves, whose planar shape is a narrow rectangle, which are arranged at positions on the inner side of the inner ring circumference of the first narrow groove ring, and four sides of the rectangular narrow groove are arranged parallel to the inner ring circumference of the first narrow groove ring, wherein one intermediate withstand voltage portion and a plurality of narrow groove withstand voltage portion are constituted by the semiconductor filler filled into the first narrow groove ring and the rectangular narrow grooves, wherein the surface of the narrow groove withstand voltage portions and the substrate surface between the narrow groove withstand voltage portions is in contact with the electrode film, and wherein, the distance a between the long sides of the narrow groove withstand voltage portions opposing to the inner ring circumference of the intermediate withstand voltage portion and the inner ring circumference of the intermediate withstand voltage portion is set to substantially twice the distance b between the short sides of the narrow groove withstand voltage portions and the inner ring circumference of the intermediate withstand voltage portion.

According to a second aspect of the present invention, in a diode element according to the first aspect of the present invention, the intermediate withstand voltage portion does not contact the electrode film and is at floating potential.

According to a third aspect of the present invention, in a diode element according to the first aspect of the present invention, the grooves further include a ring-shaped second narrow groove ring enclosing the first narrow groove ring, wherein an outer withstand voltage portion is constituted by the semiconductor filler filled into the second narrow groove ring, wherein the intermediate withstand voltage portion contacts the electrode film, and wherein the outer withstand voltage portion does not contact the electrode film and is at floating potential.

According to a fourth aspect of the present invention, a diode element according the first aspect of the present invention, includes a plurality of narrow groove withstand voltage portions, wherein the narrow groove withstand voltage portions are arranged in parallel to one another at a distance d between the long sides of the narrow groove withstand voltage portions; and wherein this distance d is substantially the same as the distance a between the long sides of the narrow groove withstand voltage portions opposing to the inner ring circumference of the intermediate withstand voltage portion and the inner ring circumference of the intermediate withstand voltage portion.

According to a fifth aspect of the present invention, in a diode element according to third or fourth aspect of the present invention, a ring width w of the outer withstand voltage portion and the intermediate withstand voltage portion is substantially the same as a width y of the rectangular narrow grooves, and a distance c between the inner ring circumference of the outer withstand voltage portions and the outer ring circumference of the intermediate withstand voltage portion is substantially the same as the distance a between the long sides of the narrow groove withstand voltage portions opposing to the inner ring circumference of the intermediate withstand voltage portion and the inner ring circumference of the intermediate withstand voltage portion.

In the diode element of the present invention, the distance a between the long sides of the narrow groove withstand voltage portions opposing to the inner ring circumference of the intermediate withstand voltage portion and the inner ring circumference of the intermediate withstand voltage portion is set to substantially twice the distance b between the short sides of the narrow groove withstand voltage portions and the inner ring circumference of the intermediate withstand voltage portion.

Such a diode element is shown in FIGS. 23 and 24. FIG. 23 is a plan view of the diode element, and FIG. 24 is a cross-sectional view taken along the line H—H in FIG. 23.

This diode element has a semiconductor substrate 10 of a first conductivity type, and a main surface of this semiconductor substrate is provided with narrow groove rings having a ring-shaped planar shape. A plurality of rectangular narrow grooves is arranged on the inner side of the first narrow groove ring, which is located on the innermost side. The narrow groove rings are arranged concentrically, and the rectangular narrow grooves are arranged parallel to one another. A plurality of narrow groove withstand voltage portions $25_1$ to $25_3$ made of a semiconductor filler of a second conductivity type are formed inside the rectangular narrow grooves, an intermediate withstand voltage portion 28 made of the semiconductor filler of the second conductivity type is formed in the first narrow groove ring, which is the innermost of the narrow groove rings, and an outer withstand voltage portion $27_1$ made of the same semiconductor filler is formed in the narrow grooves ring to the outside thereof.

A thermal oxide film 14 and PSG film 15 are formed lamination film in that order on the surface of semiconductor substrate 10. An opening is arranged on the center of the lamination film, and at least a part of surface of the narrow groove withstand voltage portions $25_1$ to $25_3$ and a part of surface of the semiconductor substrate 10 where the location between the narrow groove withstand voltage portions $25_1$ to $25_3$ are exposed at a bottom of the opening. An electrode film 18 is formed on the surface of the lamination film where the opening is arranged. Therefore, the electrode film 18 is in contact with the narrow groove withstand voltage portions $25_1$ to $25_3$ and semiconductor substrate 10 at the bottom of opening. At the surface of semiconductor substrate 10 interposed between intermediate withstand voltage portion 28 and narrow groove withstand portions $25_1$ to $25_3$, the lamination film is arranged, so that the surface of semiconductor substrate 10 is not in contact with the electrode film 18. Furthermore, a cathode electrode 19 forming an ohmic junction with the semiconductor substrate 10 is arranged at the surface of the semiconductor substrate 10 on the side opposite to the main suface.

In this diode 1, assuming that the first conductivity type is N and the second conductivity type is P, when a positive voltage is applied to the electrode film 18 and a negative voltage is applied to the cathode electrode 19, then the Schottky junction between the electrode film 18 and the semiconductor substrate 10 is forward biased, and a current flows through the Schottky junction from the electrode film 18 to the cathode electrode 19. In this situation, also the PN junctions between the narrow groove withstand voltage portions $25_1$ to $25_3$ and the semiconductor substrate 10 are forward biased, but the barrier height of the PN junctions is higher than the barrier height of the Schottky junction, so that either no current at all or only a very small current flows through the PN junctions.

When a negative voltage is applied to the electrode film 18 and a positive voltage is applied to the cathode electrode 19, then the Schottky junction between the electrode film 18 and the semiconductor substrate 10 and the PN junctions between the narrow groove withstand voltage portions $25_1$ to $25_3$ and the semiconductor substrate 10 are reverse biased and no current flows.

Between the narrow groove withstand voltage portions $25_1$ to $25_3$, a depletion layer spreads from the Schottky junction between the electrode film 18 and the semiconductor substrate 10 and from the PN junctions between the narrow groove withstand voltage portions $25_1$ to $25_3$ and the semiconductor substrate 10 into the semiconductor substrate 10 between the narrow groove withstand voltage portions $25_1$ to $25_3$. On the other hand, between the inner ring circumference of the intermediate withstand voltage portion 28 and the narrow groove withstand voltage portions $25_1$ to $25_3$, the electrode film 18 is not in contact with the surface of the semiconductor substrate 10, and no Schottky diode is formed, so that the depletion layer spreads only from the PN junctions between the narrow groove withstand voltage portions $25_1$ to $25_3$ and the semiconductor substrate 10 into the semiconductor substrate 10.

Numeral 25 in FIG. 25 denotes one narrow groove withstand voltage portion of narrow rectangular shape, whose long sides are parallel and adjacent to the inner ring circumference of the intermediate withstand voltage portion 28.

Numeral 25d in FIG. 25 denotes the edge of the outward-facing depletion layer spreading in outward direction from the PN junction between the long sides of the narrow groove withstand voltage portion 25 and the semiconductor substrate 10. Numeral 28d in FIG. 25 denotes the edge of the inward-facing depletion layer spreading in inward direction from the PN junction between the inner ring circumference of the intermediate withstand voltage portion 28 and the semiconductor substrate 10. In FIG. 25, the depletion layer spreading from the Schottky junction formed between the semiconductor substrate 10 and the electrode film 18 has been omitted.

Ordinarily, the impurity concentration of the substrate is uniform, and when the same voltage is applied to the intermediate withstand voltage portion 28 and all narrow groove withstand voltage portions $25_1$ to $25_3$, then the width of the depletion layer spreading from the intermediate withstand voltage portion 28 is the same as the width of the depletion layers spreading from the narrow groove withstand voltage portions $25_1$ to $25_3$.

Consequently, if the depletion layer spreading from the intermediate withstand voltage portion 28 contacts the depletion layers spreading from the narrow groove withstand voltage portions 25 adjacent to the intermediate withstand voltage portion 28, then the depletion layers meet at a location that is in the middle between the intermediate withstand voltage portion 28 and the narrow groove withstand voltage portion 25.

Since a is the distance between the inner ring circumference of the intermediate withstand voltage portion 28 and the long side of the narrow groove withstand voltage portions 25 adjacent to the intermediate withstand voltage portion 28, the edge 28d of the depletion layer spreading in inward direction from the intermediate withstand voltage portion 28 and the edge 25d of the depletion layers spreading in outward direction from the long side of the narrow groove withstand voltage portions 25 meet at a location at half that distance a/2.

The reference numerals $70_1$ to $70_4$ in FIG. 25 denote corner portions, which are the vicinities of the four corners of one narrow groove withstand voltage portion 25, and these corner portions $70_1$ to $70_4$ are formed at the four corners of each of the narrow groove withstand voltage portions $25_1$ to $25_3$ respectively.

Ordinarily, the depletion layers spreading in outward direction from the long sides of the narrow groove withstand voltage portions $25_1$ to $25_3$ except for the corner portions $70_1$ to $70_4$ extend in a direction perpendicular to the long side. The depletion layer spreading in outward direction from the corner portions $70_1$ to $70_4$ extend not only in the direction perpendicular to the long side but also in the direction perpendicular to the short side. At the corner portions $70_1$ to $70_4$, an amount of depletion layer spreading in the direction perpendicular to the long side is smaller than the amount of depletion layer spreading from the long side except for the corner portions $70_1$ to $70_4$. In the result, the outward edge 25d of the depletion layer at the corner portions $70_1$ to $70_4$ is rounded.

Assuming that the four corners of the depletion layer are rounded and the outward edge 25d of the outward-facing depletion layer contact the long side of the edge 28d of the inward-facing depletion layer except at the corner portions $70_1$ to $70_4$, at a position of the distance a/2, then virtual deficient portions of depletion layer appear in the regions close to the corner portions $70_1$ to $70_4$.

FIG. 26 is a partial enlarged view of the intermediate withstand voltage portion 28 denoted by numeral 30 in FIG. 25 and one narrow groove withstand voltage portion 25 opposing to its inner ring circumference. Numeral 82 in FIG. 26 denotes the edge of the outward-facing depletion layer, assuming that it has reached the distance a/2 perpendicular to the long edges in a situation in which the outward-facing edge of the depletion layer near the corner portions $70_1$ to $70_4$ is rounded. Numeral 81a in FIG. 26 is the line marking the position at a distance of a/2.

Numeral 81 in FIG. 26 denotes the virtual deficient portion of the depletion layer. This virtual deficient portion 81 is the region enclosed by the extending line 81b extended from the short side of the narrow groove withstand voltage portion 25, the line 81a and the edge 82 of the depletion layer.

This virtual deficient portion 81 appears at each of the four outward corners of the outward-facing depletion layer, so that there are four in total such virtual deficient portions 81.

Numeral 80 in FIG. 26 denotes the protruding portion enclosed by the line 86, which is line parting the short side of that narrow groove withstand voltage portion 25 in two equal parts, the extending line 81b and the edge 82 of the depletion layer. This protruding portion 80 appears twice at each short side of the narrow groove withstand voltage portion 25, so that there are a total of four for each narrow groove withstand voltage portion 25. The total volume of these four protruding portions 80 is equal to the total volume of the depletion layer spreading from the short side of the narrow groove withstand voltage portion 25. The total volume of the depletion layer bulging out is the same as the total volume of the above-described four virtual deficient portions 81, so that when the four protruding portions 80 are assumed to be allocated to the respective four virtual deficient portions 81, then the depletion layer spreading from one narrow groove withstand voltage portion 25 spreads to an narrow rectangular shape in a direction perpendicular to the long sides of the narrow groove withstand voltage portion 25, but does not spread at all from the short sides.

Even in this situation in which the depletion layer does not spread at all from the short sides of the narrow groove withstand voltage portion 25, the edge 28d of the depletion layer extending from the inner ring circumference of the intermediate withstand voltage portion 28 should reach the short side of the narrow groove withstand voltage portion 25, in order to deplete the substrate between the short sides of the narrow groove withstand voltage portions 25 and the intermediate withstand voltage portion 28.

When the edge 25d of the outward-facing depletion layer spreading from the narrow groove withstand voltage portion 25 and the edge 28d of the inward-facing depletion layer spreading from the inner ring circumference of the intermediate withstand voltage portion 28 meet, and the inward-facing depletion layer extends for the distance a/2 at the portion opposing to the long side of the narrow groove withstand voltage portion 25, then it extends also for the distance a/2 at the portion opposing to the short sides of the narrow groove withstand voltage portion 25. Consequently, if the distance between the inner ring circumference of the intermediate withstand voltage portion 28 and the short side of the narrow groove withstand voltage portions 25 is set to a/2, then the edge 28d of the depletion layer spreading from the inner ring circumference of the intermediate withstand voltage portion 28 reaches the short side of the narrow groove withstand voltage portion 25 in this situation, and the substrate between the short side of the narrow groove withstand voltage portion 25 and the inner ring circumference of the intermediate withstand voltage portion 28 is completely depleted.

Since the narrow groove withstand voltage portions 25 are arranged parallel each other, the depletion layer spreads also in the substrate located between the two sides of parallel adjacent narrow groove withstand voltage portions 25.

When the substrate between the narrow groove withstand voltage portions 25 and the inner ring circumference of the intermediate withstand voltage portion 28 is completely depleted, then the outward-facing depletion layer spreading from the long side of the narrow groove withstand voltage portions 25 extends for the distance a/2.

If the distance between the long sides of adjacent narrow groove withstand voltage portions 25 is set to the distance a, then the edge of the depletion layers extending from the long sides of the adjacent narrow groove withstand voltage portions 25 also spread for a/2 each, and they meet in the middle between the adjacent narrow groove withstand voltage portions 25, so that when the substrate between the narrow groove withstand voltage portions 25 and the inner ring circumference of the intermediate withstand voltage portion 28 is completely depleted, also the substrate between the adjacent narrow groove withstand voltage portions 25 is completely depleted.

As described above, the distance between the inner ring circumference of the intermediate withstand voltage portion 28 and the long sides of the narrow groove withstand voltage portions 25 is set to a, the distance between the inner ring circumference of the intermediate withstand voltage portion 28 and the short sides of the narrow groove withstand voltage portions 25 is set to a/2, and the distance between the adjacent narrow groove withstand voltage portions 25 is set to a, then the substrate inward from the inner ring circumference of the intermediate withstand voltage portion 28 is completely depleted.

If the depletion layer has spread for the distance a/2 inward from the inner ring circumference of the intermediate withstand voltage portion 28, then the depletion layer also spreads for the distance a/2 outward from the outer ring circumference of the intermediate withstand voltage portion 28.

As shown in FIG. 23, a ring-shaped outer withstand voltage portion $27_1$ is arranged on the outer side of the outer ring circumference of the intermediate withstand voltage portion 28. If the intermediate withstand voltage portion 28 and the outer withstand voltage portion $27_1$ are at the same potential when the depletion layer has spread for the distance a/2 from the outer ring circumference of the intermediate withstand voltage portion 28, the depletion layer spreads for the distance a/2 inward from the inner ring circumference of the outer withstand voltage portion $27_1$.

Consequently, if the distance between the outer ring circumference of the intermediate withstand voltage portion 28 and inner ring circumference of the outer withstand voltage portion $27_1$ is set to a, then the edges of the adjacent depletion layers meet and the substrate between the intermediate withstand voltage portion 28 and the outer withstand voltage portion is completely depleted when the depletion layer has spread outward for the distance a/2 from the outer ring circumference of the intermediate withstand voltage portion 28. When the substrate inward from the inner ring circumference of the intermediate withstand voltage portion 28 is completely depleted, then the depletion layer spreads for the distance a/2 outward from the outer ring circumference of the intermediate withstand voltage portion 28, so that in this situation, the substrate located on the inner side of the outer withstand voltage portion $27_1$ is completely depleted.

It should be noted that if the N-type substrate on the inner side of the inner ring circumference of the intermediate withstand voltage portion 28 is completely depleted, then the narrow groove withstand voltage portions 25, which are P-type regions located on the inner side of the inner ring circumference of the intermediate withstand voltage portion 28 is completely depleted, and the depletion layer also spread into the intermediate withstand voltage portion 28.

Furthermore, if the N-type substrate located on the inner side of the inner ring circumference of any outer withstand voltage portion is completely depleted, the P-type region located on the inner side of that outer withstand voltage portion, such as the outer withstand voltage portion or the intermediate withstand voltage portion, are completely depleted, and a depletion layer spreads also to the inside of that outer withstand voltage portion.

BRIEF DESCRIPTION OF THE DRAWINGS

FIG. 17 is a plan view illustrating a diode element according to an embodiment of the present invention in which relay diffusion layers are provided.

FIG. 18 is a cross-sectional view along the line F—F in FIG. 17.

FIG. 19 is a plan view illustrating the structure of another embodiment according to the present invention.

FIG. 20 is a cross-sectional view along the line G—G in FIG. 19.

FIG. 21 is a plan view illustrating the structure of a conventional diode.

FIG. 22 is a cross-sectional view along the line P—P in FIG. 21.

DESCRIPTION OF THE PREFERRED EMBODIMENTS

The following is a description of embodiments of the present invention, with reference to the accompanying drawings.

First, a method for manufacturing a diode in accordance with an embodiment of the present invention is described.

Figure 3:
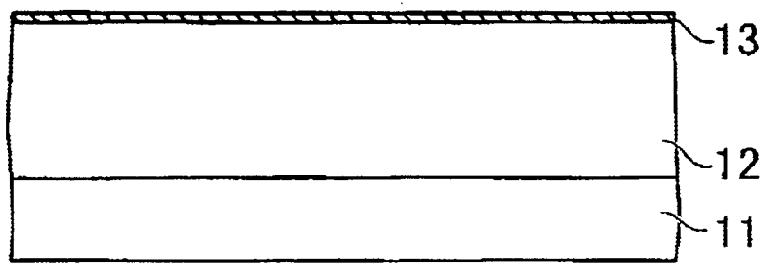
FIG. 3 is a first cross-sectional view illustrating a process for manufacturing a diode element according to an embodiment of the present invention.

In FIG. 3, numeral 11 denotes an N-type silicon substrate 11. An N-type epitaxial layer 12 is formed on the surface of this silicon substrate 11, and a thermal oxide film 13 is formed on the surface of the N-type epitaxial layer 12. The silicon substrate 11 and the epitaxial layer 12 are an example of a substrate of the present invention.

Figure 4:
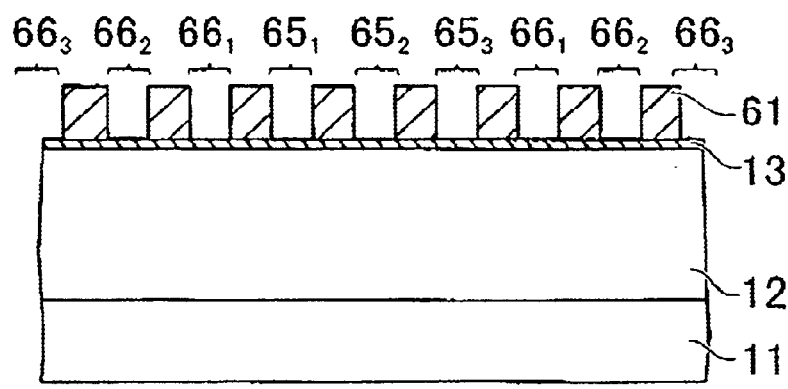
FIG. 4 is a second cross-sectional view illustrating a process for manufacturing a diode element according to an embodiment of the present invention.
Figure 15:
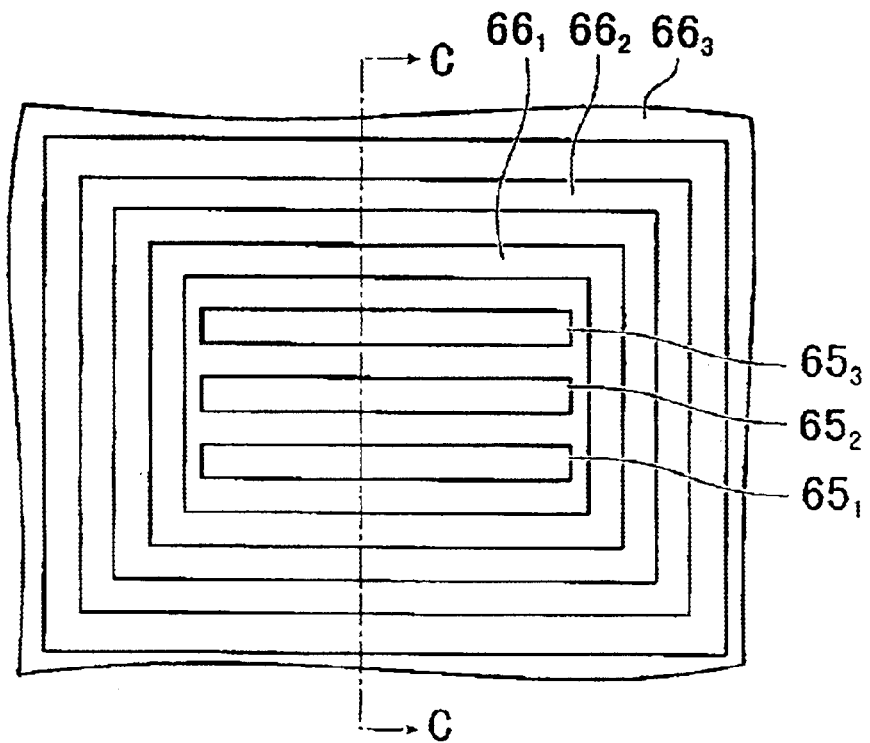
FIG. 15 is a first plan view illustrating a process for manufacturing a diode element according to an embodiment of the present invention.

Next, a patterned resist film 61 is formed on the surface of the oxide film 13, as shown in FIG. 4. As shown in the plan view of FIG. 15, this resist film 61 has a plurality of openings $66_1$ to $66_3$ whose planar shape is that of a rectangular ring and a plurality of openings $65_1$ to $65_3$ having an narrow rectangular planar shape. The thermal oxide film 13 is exposed at the bottom of the rectangular ring-shaped openings $66_1$ to $66_3$ and the narrow rectangular openings $65_1$ to $65_3$.

In this example, three rectangular ring-shaped openings $66_1$ to $66_3$ and three narrow rectangular openings $65_1$ to $65_3$ are provided. It should be noted that FIG. 4 corresponds to a cross-sectional view along the line C—C in FIG. 15. The rectangular ring-shaped openings $66_1$ to $66_3$ are arranged concentrically, and the openings $65_1$ to $65_3$ having a narrow rectangular planar shape are arranged on the inner side of the innermost rectangular ring-shaped openings $66_1$. The narrow rectangular openings $65_1$ to $65_3$ are arranged parallel to one another, and are arranged on the inner side of the inner circumference of the innermost rectangular ring-shaped opening $66_1$.

Figure 5:
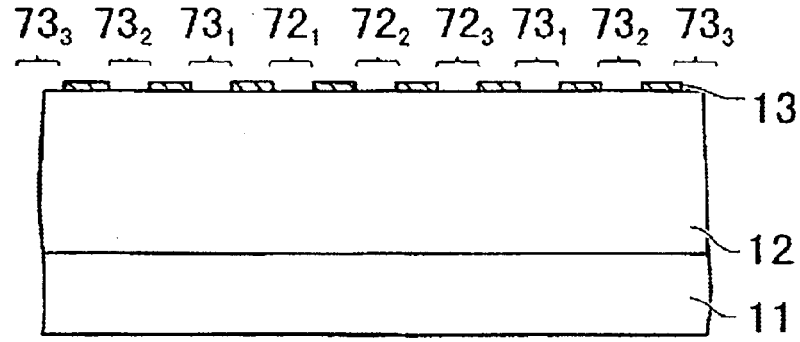
FIG. 5 is a third cross-sectional view illustrating a process for manufacturing a diode element according to an embodiment of the present invention.

Next, taking the resist film 61 as a mask, the thermal oxide film 13 is etched, and the thermal oxide film 13 exposed at the bottom of the narrow rectangular openings $65_1$ to $65_3$ and the rectangular ring-shaped openings $66_1$ to $66_3$ is removed. The openings having the same shape as the narrow rectangular openings $65_1$ to $65_3$ and openings having the same shape as the rectangular ring-shaped openings $66_1$ to $66_3$ are formed in the thermal oxide film 13. Then, the resist film 61 is removed. This situation is shown in FIG. 5. The narrow rectangular openings are denoted by the numerals $72_1$ to $72_3$ and the rectangular ring-shaped openings are denoted by the numerals $73_1$ to $73_3$.

Figure 6:
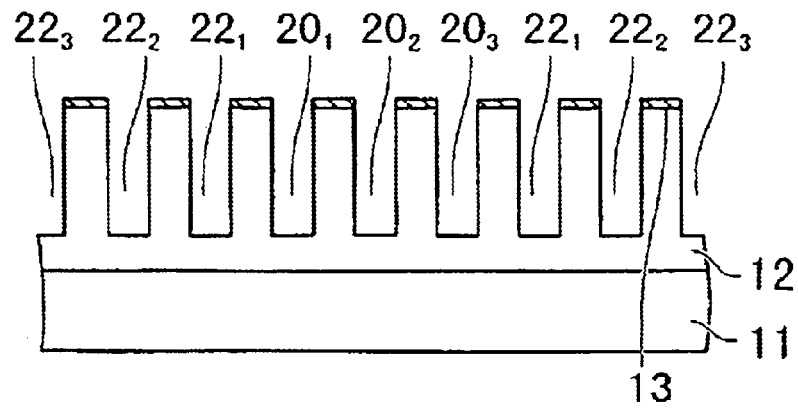
FIG. 6 is a fourth cross-sectional view illustrating a process for manufacturing a diode element according to an embodiment of the present invention.

Next, taking the thermal oxide film 13 as a mask, the epitaxial layer 12 is etched. As shown in FIG. 6, the epitaxial layer 12 exposed at the bottom of the narrow rectangular openings $72_1$ to $72_3$ and the bottom of the rectangular ring-shape openings $73_1$ to $73_3$ is removed, forming narrow grooves $20_1$ to $20_3$ having the planar shape of narrow oblong rectangles and located at the position of the narrow rectangular openings $72_1$ to $72_3$, as well as rectangular ring-shaped grooves $22_1$ to $22_3$ having the planar shape of rectangular rings and located at the position of the rectangular ring-shaped openings $73_1$ to $73_3$. The bottom of the narrow grooves $20_1$ to $20_3$ and the rectangular ring-shaped grooves $22_1$ to $22_3$ is located inside the epitaxial layer. The narrow grooves $20_1$ to $20_3$ and the rectangular ring-shaped grooves $22_1$ to $22_3$ are formed with the same depth.

Figure 7:
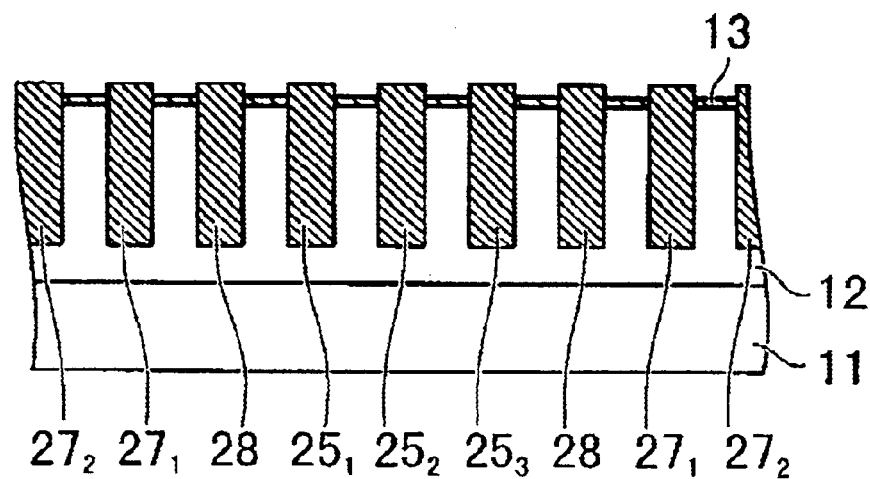
FIG. 7 is a fifth cross-sectional view illustrating a process for manufacturing a diode element according to an embodiment of the present invention.

Next, an epitaxial layer is grown inside the narrow rectangular grooves $20_1$ to $20_3$ and the rectangular ring-shaped grooves $22_1$ to $22_3$ under doping of boron, which serves as a P-type impurity which is a opposing conductivity type to the epitaxial layer 12. As shown in FIG. 7, narrow groove withstand voltage portions $25_1$ to $25_3$ of narrow rectangular shape made of a P-type epitaxial layer are formed in the narrow rectangular grooves $20_1$ to $20_3$, and an intermediate withstand voltage portion 28 as well as outer withstand voltage portions $27_1$ and $27_2$ made of a P-type epitaxial layer are formed in the innermost rectangular ring-shaped groove $22_1$ and the outer rectangular ring-shaped $22_2$ and $22_3$.

Figure 8:
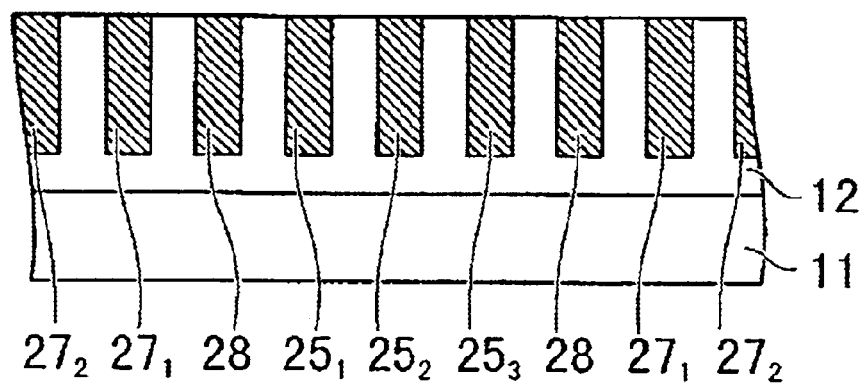
FIG. 8 is a sixth cross-sectional view illustrating a process for manufacturing a diode element according to an embodiment of the present invention.

As shown in FIG. 8, the surface of the epitaxial layer 12 is abraded to remove the narrow groove withstand voltage portions $25_1$ to $25_3$, the intermediate withstand voltage portion 28 and the outer withstand voltage portions $27_1$ and $27_2$ protruding up from the surface of the epitaxial layer, as well as the thermal oxide film 13.

Figure 9:
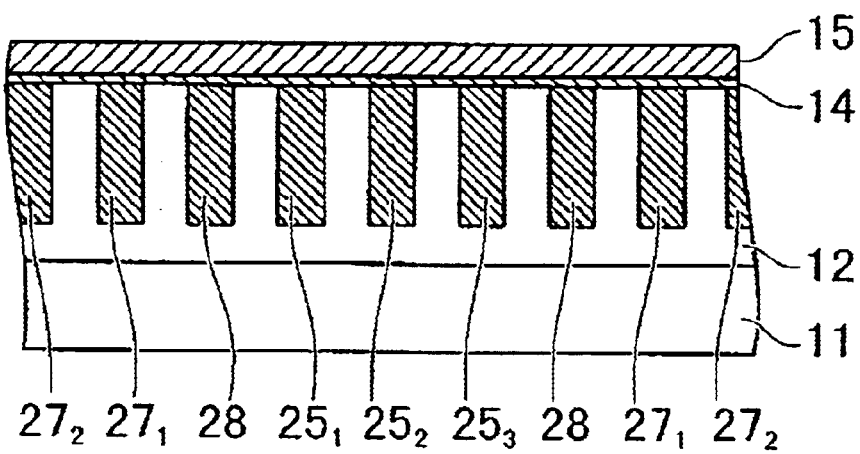
FIG. 9 is a seventh cross-sectional view illustrating a process for manufacturing a diode element according to an embodiment of the present invention.

Next, after forming a thermal oxide film 14 on the surface of the epitaxial layer 12 including the surface inside of these grooves by thermal oxidation, a PSG film is formed on the surface of the thermal oxide film 14 by CVD method or the like. In FIG. 9, numeral, 14 denotes the thermal oxide film and numeral 15 denotes the PSG film.

Figure 10:
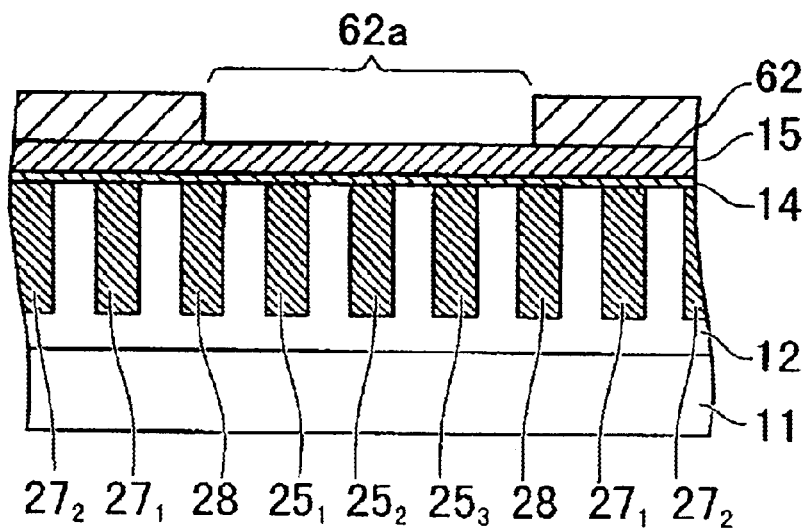
FIG. 10 is an eighth cross-sectional view illustrating a process for manufacturing a diode element according to an embodiment of the present invention.
Figure 16:
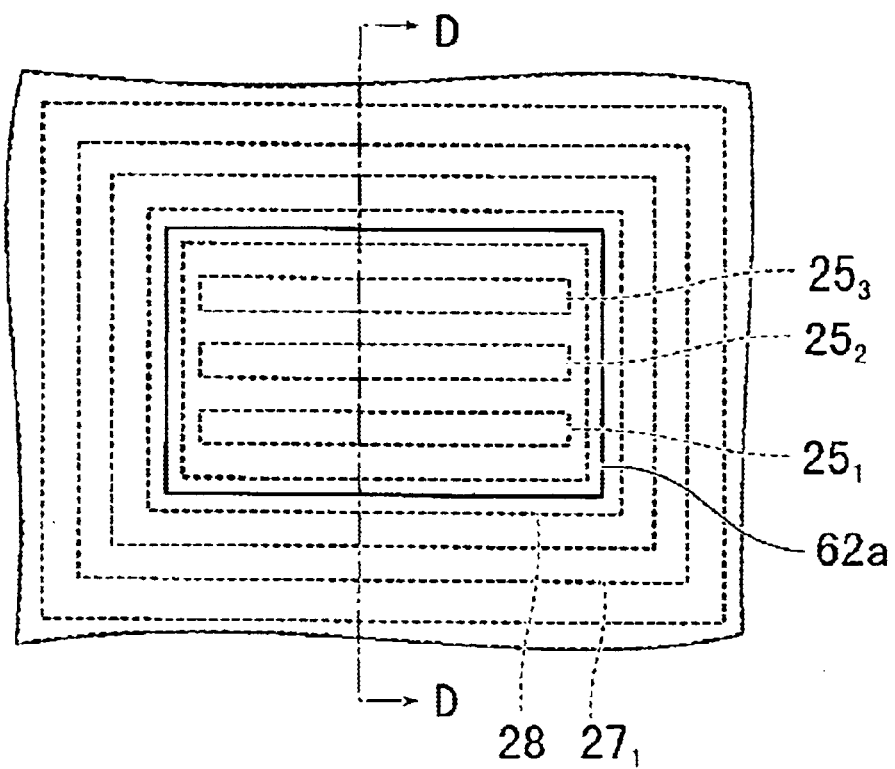
FIG. 16 is a second plan view illustrating a process for manufacturing a diode element according to an embodiment of the present invention.
Figure 23:
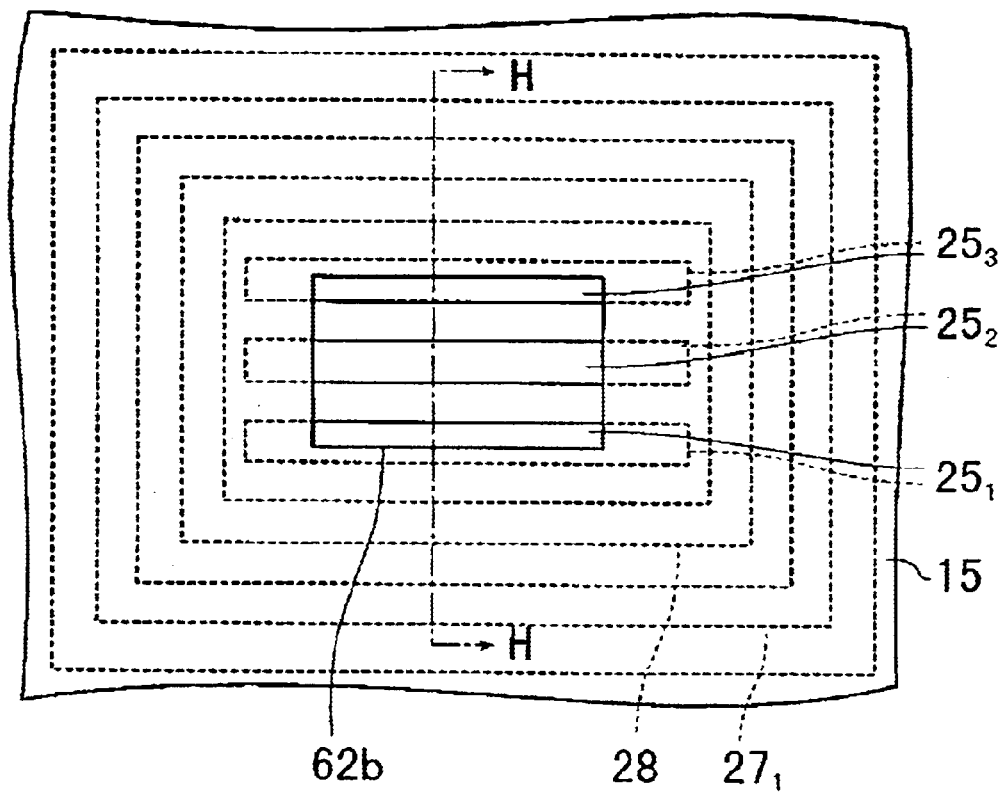
FIG. 23 is a plan view illustrating a diode element of the present invention.
Figure 24:
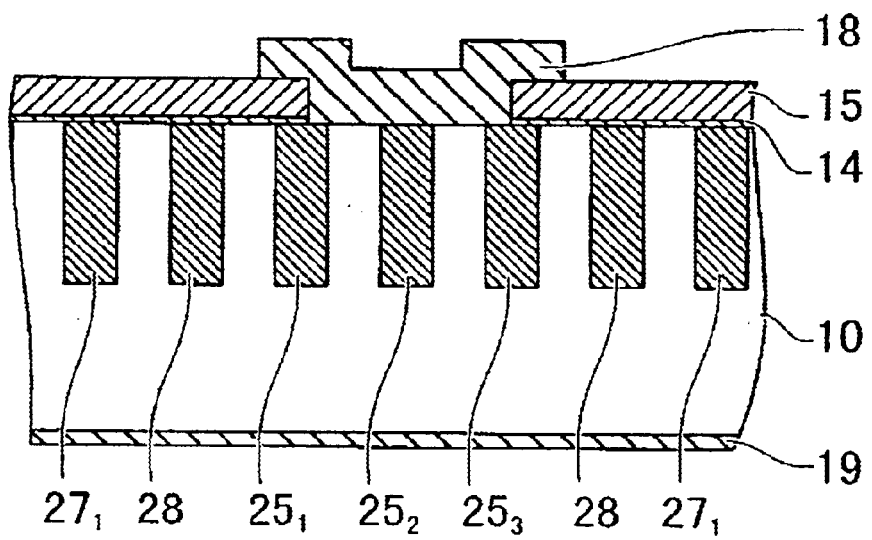
FIG. 24 is a cross-sectional view along the line H—H in FIG. 23.
Figure 25:
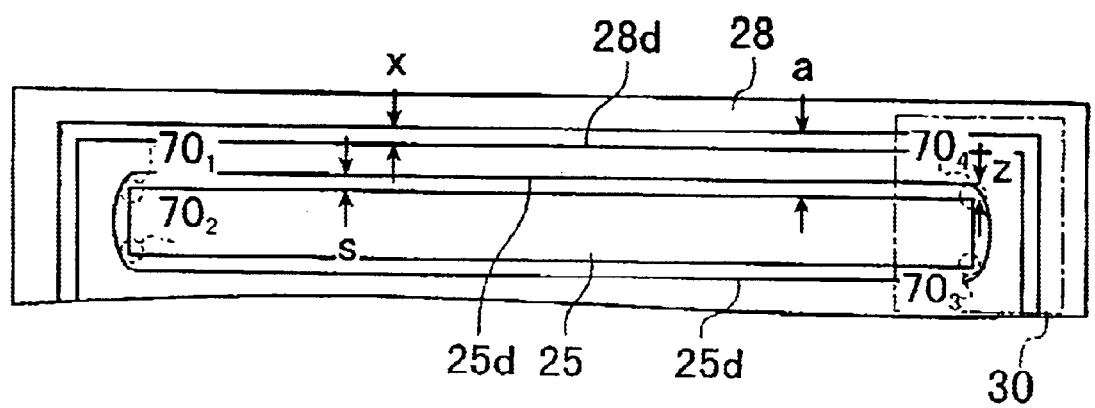
FIG. 25 is a plan view illustrating how the intermediate withstand voltage portion and the narrow groove withstand voltage portion near its inner ring circumference are arranged.
Figure 26:
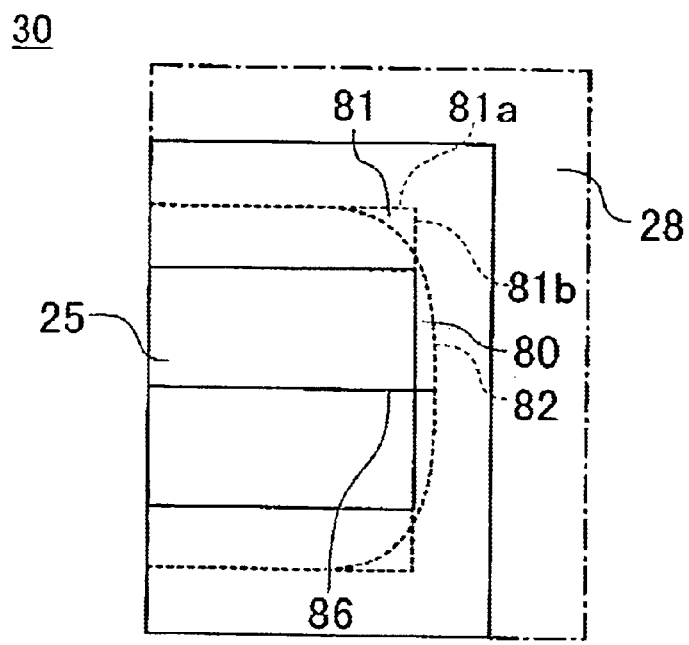
FIG. 26 is a plan view showing a virtual depletion layer spreading from near the corner portions of a narrow groove withstand voltage portion of the present invention.

Next, a patterned resist film 62 is formed on the surface of the PSG film 15, as shown in FIG. 10. This resist film 62, whose plan view is shown in FIG. 16, has an opening 62a, and at least the narrow groove withstand voltage portions $25_1$ to $25_3$ and the epitaxial layer 12 between the narrow groove withstand voltage portions $25_1$ to $25_3$ are located below this opening 62a. Here, the opening 62a is rectangular, and its edge is located between the inner ring circumference and the outer ring circumference of the intermediate withstand voltage portion 28. It should be noted that FIG. 10 is a cross-sectional view along the line D—D in FIG. 16.

Figure 11:
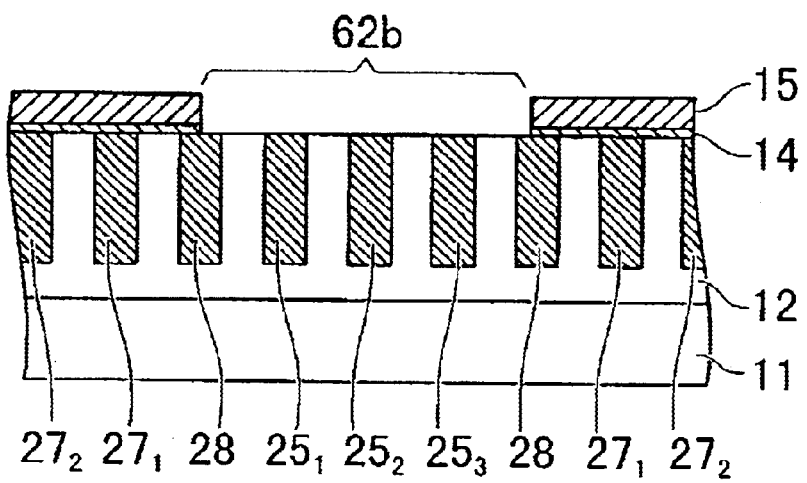
FIG. 11 is a ninth cross-sectional view illustrating a process for manufacturing a diode element according to an embodiment of the present invention.

Then, taking the resist film 62 as a mask, the PSG film 15 and the thermal oxide film 14 are etched, the PSG film and the thermal oxide film 14 exposed at the opening 62a are removed, and an opening 62b having the same shape as the opening 62a is formed in the PSG film 15 and the thermal oxide film 14. The epitaxial layer 12, the narrow groove withstand voltage portions $25_1$ to $25_3$ and a part of the intermediate withstand voltage portion 28 are exposed at the bottom of the opening 62b. Then, the resist film 62 is removed, and this situation is shown in FIG. 11.

Figure 12:
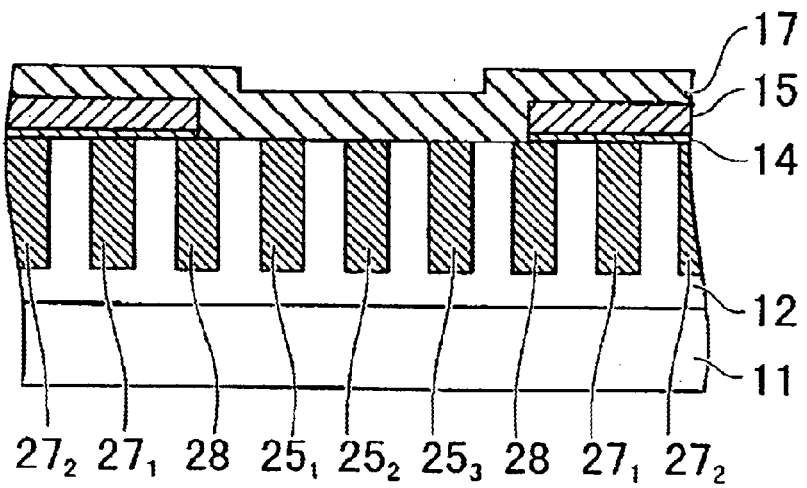
FIG. 12 is a tenth cross-sectional view illustrating a process for manufacturing a diode element according to an embodiment of the present invention.

A metal film 17 is formed on the entire surface. As shown in FIG. 12, this metal film 17 is in contact with the epitaxial layer 12, the narrow groove withstand voltage portions $25_1$ to $25_3$, and the intermediate withstand voltage portion 28 exposed at the bottom of the opening 62b. The metal film 17 forms a Schottky junction with the epitaxial layer 12, and an ohmic junction with the narrow groove withstand voltage portions $25_1$ to $25_3$ and the intermediate withstand voltage portion 28.

Figure 13:
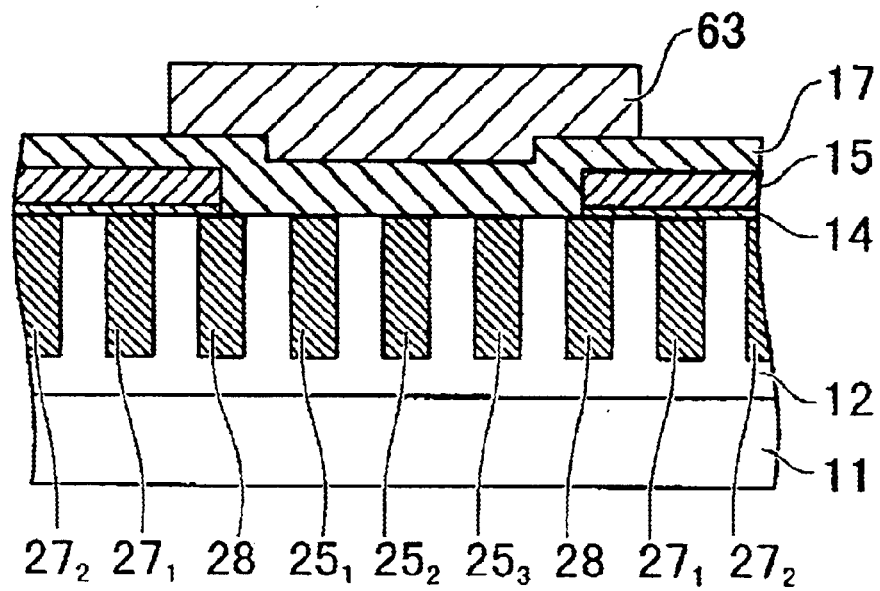
FIG. 13 is a eleventh cross-sectional view illustrating a process for manufacturing a diode element according to an embodiment of the present invention.

Then, a patterned resist film 63 is formed on the surface of the metal film 17, as shown in FIG. 13. This resist film 63 is formed as a rectangle that is similar to the opening 62b, but larger than the opening 62b.

Figure 14:
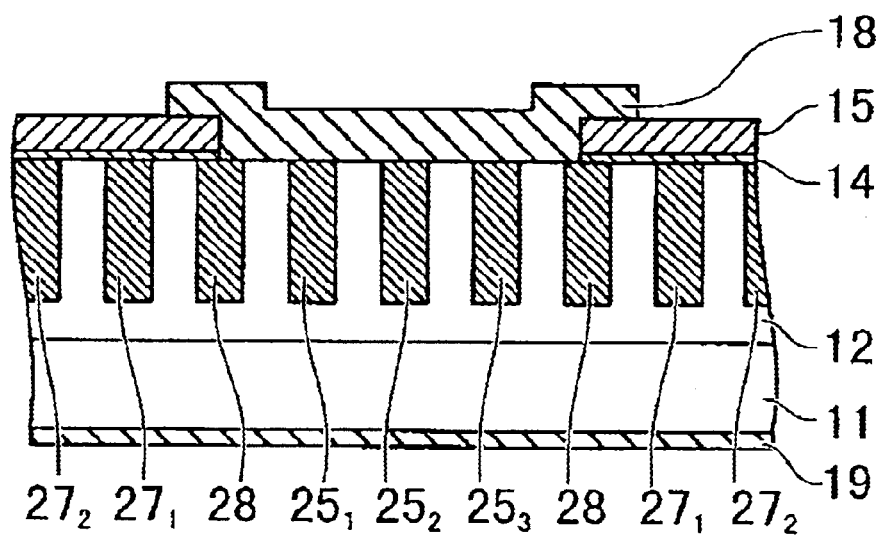
FIG. 14 is a twelfth cross-sectional view illustrating a process for manufacturing a diode element according to an embodiment of the present invention.

Next, taking the resist film 63 as a mask, the metal film 17 is etched. The metal film 17 at the exposed portions is removed, as shown in FIG. 14, and forming an anode electrode 18 made of the metal film remaining at the location where the resist film 63 was formed. This anode electrode 18 is an example of an electrode film of the present invention. Then, the resist film 63 is stripped off, and a cathode electrode 19 made of a metal thin film that forms an ohmic junction with the silicon substrate 11 is formed on the surface of the silicon layer 11 which is on the side opposite from the epitaxial layer 12.

Figure 1:
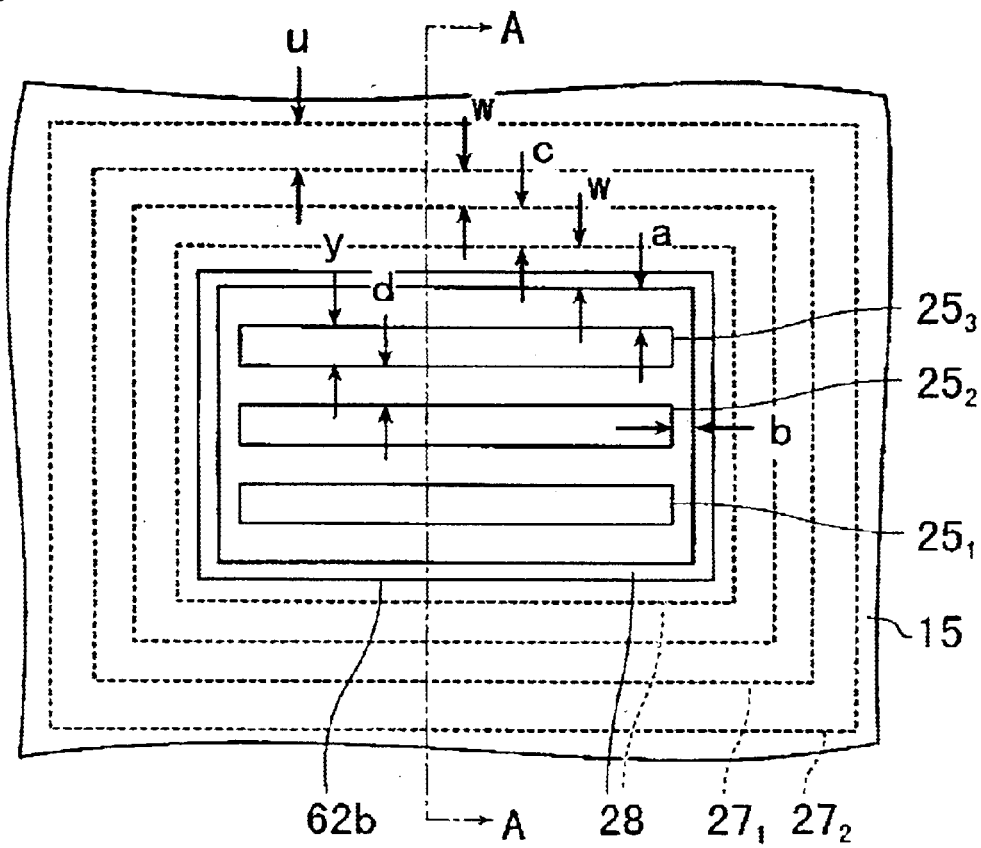
FIG. 1 is a plan view illustrating a diode element according to an embodiment of the present invention.
Figure 2:
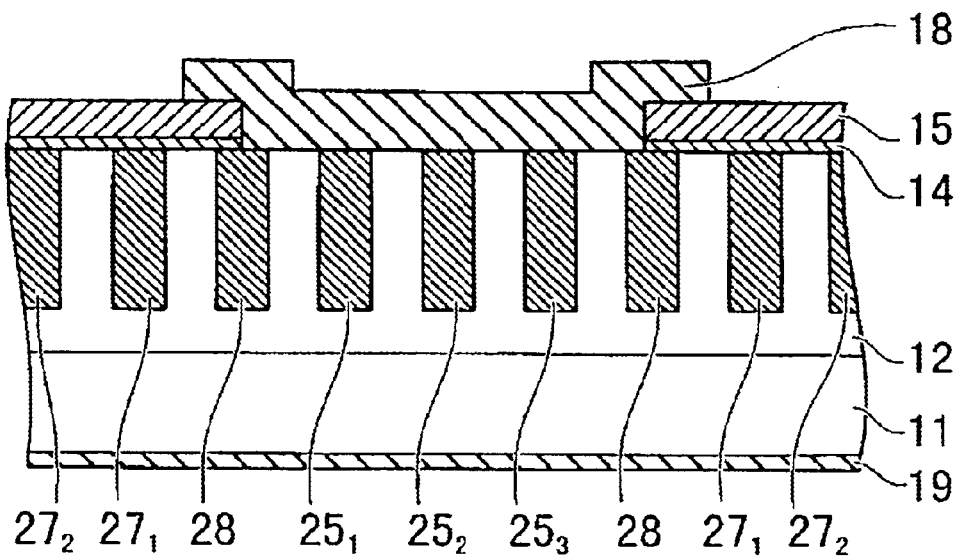
FIG. 2 is a cross-sectional view along the line A—A in FIG. 1.

With the above steps, a diode 5 is obtained, whose plan view is shown in FIG. 1 and whose cross-sectional view along the line A—A in FIG. 1 is shown in FIG. 2. It should be noted that for illustrative reasons, the anode electrode 18 is not shown in FIG. 1.

In this diode 5, the bottom of the anode electrode film 18 is in contact with the epitaxial layer 12, the narrow groove withstand voltage portions $25_1$ to $25_3$ and the intermediate withstand voltage portion 28 exposed at the bottom of the opening 62b of the PSG film 15 and the thermal oxide film 14, as described above. When a positive voltage is applied to the anode electrode 18 and a negative voltage is applied to the cathode electrode 19, then the Schottky junction between the anode electrode 18 and the epitaxial layer 12 is forward biased, and a current flows from the anode electrode 18 to the cathode electrode 19.

In this situation, the PN junctions between the narrow groove withstand voltage portions $25_1$ to $25_3$ and the epitaxial layer 12 as well as the PN junction between the intermediate withstand voltage portion 28 and the epitaxial layer 12 are forward biased, but the current flowing through the PN junctions is much smaller than the current flowing through the Schottky junction.

When, conversely, a negative voltage is applied to the anode electrode 18 and a positive voltage is applied to the cathode electrode 19, the Schottky junction between the anode electrode 18 and the epitaxial layer 12 as well as the PN unctions between the narrow groove withstand voltage portions $25_1$ to $25_3$ and the intermediate withstand voltage portion 28 and the epitaxial layer 12 are reverse biased, so that no current flows. In this situation, near the surface of the epitaxial layer 12 on the inner side of the intermediate withstand voltage portion 28, a depletion layer spreads from the Schottky junction between the anode electrode 18 and the epitaxial layer 12 in the depth direction of the epitaxial layer 12, and at a deeper portion of the epitaxial layer 12, a depletion layer spreads from the PN junctions between the intermediate withstand voltage portion 28 and the narrow groove withstand voltage portions $25_1$ to $25_3$ and the epitaxial layer 12 in lateral direction within the epitaxial layer 12.

In this diode 5, the distance a between the long sides of the narrow groove withstand voltage portions $25_1$ to $25_3$ and the inner ring circumference of the intermediate withstand voltage portion 28 is set to twice the distance b between the short sides of the narrow groove withstand voltage portions $25_1$ to $25_3$ and the inner ring circumference of the intermediate withstand voltage portion 28. Furthermore, the distance c between the inner ring circumference of the innermost of the outer withstand voltage portions $27_1$ and the outer ring circumference of the intermediate withstand voltage portion 28, the distance u between the adjacent outer withstand voltage portions $27_1$ and $27_2$, and the distance d between the adjacent long side of the narrow groove withstand voltage portions $25_1$ to $25_3$ are all equal to the distance a between the long sides of the narrow groove withstand voltage portions $25_1$ to $25_3$ and the inner ring circumference of the intermediate withstand voltage portion 28. Here, the distance a is set to 2.4 μm and the ring width w is set to 0.6 μm.

With this structure, assuming that due to the depletion layer spreading in the lateral direction from the intermediate withstand voltage portion 28 and the narrow groove withstand voltage portions $25_1$ to $25_3$ the epitaxial layer 12 between the long sides of the narrow groove withstand voltage portions $25_1$ to $25_3$ and inner ring circumference of the intermediate withstand voltage portion 28 becomes depleted, then the epitaxial layer 12 on the inner side of the intermediate withstand voltage portion 28, between the innermost outer withstand voltage portion $27_1$ and the outer ring circumference of the intermediate withstand voltage portion 28, and between the adjacent outer withstand voltage portions $27_1$ and $27_2$ is depleted by the depletion layer spreading in the lateral direction from the intermediate withstand voltage portion 28.

Furthermore, with this diode 5, the ring width w of the outer withstand voltage portions $27_1$ and $27_2$ and the intermediate withstand voltage portion 28 as well as the width y of the narrow groove withstand voltage portions $25_1$ to $25_3$ are the same.

The depletion layers spread not only in the epitaxial layer 12, but also inside the narrow groove withstand voltage portions $25_1$ to $25_3$, the intermediate withstand voltage portion 28, and the outer withstand voltage portions $27_1$ and $27_2$. Since the width y of the narrow groove withstand voltage portions $25_1$ to $25_3$, and the width w of the intermediate withstand voltage portion 28 and the outer withstand voltage portions $27_1$ and $27_2$ are the same, when the inside of the narrow groove withstand voltage portions $25_1$ to $25_3$ is completely depleted, the inside of the intermediate withstand voltage portion 28 and the outer withstand voltage portions $27_1$ and $27_2$ is completely depleted. So that the epitaxial layer 12 located on the inner side of the outermost outer withstand voltage portion $27_2$, as well as the inside of the narrow groove withstand voltage portions $25_1$ to $25_3$, the intermediate withstand voltage portion 28 and the outer withstand voltage portions $27_1$ and $27_2$ are completely depleted.

Consequently, there is no local concentration of electric fields at portions located on the inner side from the outermost outer withstand voltage portion $27_2$. Therefore, the withstand voltage is higher than in conventional elements, in which there are locations that are not depleted, and these locations occur local concentration of electric fields.

It should be noted that the above-described diode 5 has been explained for the case that two outer withstand voltage portions $27_1$ and $27_2$ are provided, but the present invention is not limited to this embodiment, and it is also possible to provide only one or three or more outer withstand voltage portions 27. If three or more outer withstand voltage portions 27 are provided, and if the distance a between the long sides of the narrow groove withstand voltage portions $25_1$ to $25_3$ and the inner ring circumference of the intermediate withstand voltage portion 28 is set to twice the distance b between the short sides of the narrow groove withstand voltage portions $25_1$ to $25_3$ and the inner ring circumference of the intermediate withstand voltage portion 28, and the distance c between the inner ring circumference of the innermost of the outer withstand voltage portions $27_1$ and the outer ring circumference of the intermediate withstand voltage portion 28, the distance u between adjacent outer withstand voltage portions 27, and the distance d between the adjacent long sides of narrow groove withstand voltage portions $25_1$ to $25_3$ are all equal to the distance a between the narrow groove withstand voltage portions $25_1$ to $25_3$ and the intermediate withstand voltage portion 28, and the width w of the intermediate withstand voltage portion 28 and the outer withstand voltage portions 27 as well as the width y of the narrow groove withstand voltage portions $25_1$ to $25_3$ are all the same, then, as in the diode 5, the epitaxial layer 12 located on the inner side of the outermost outer withstand voltage portion 27 as well as inside of the narrow groove withstand voltage portions $25_1$ to $25_3$, the intermediate withstand voltage portion 28, and the outer withstand voltage portions 27 all become depleted.

Furthermore, the present invention is not limited to the structure described above, and it is also possible to provide a diode 2 comprising the below-described relay diffusion layer in addition to the above-described diode 5, as shown in the plan view of FIG. 17 and in FIG. 18, which is a cross-sectional view along the line F—F in FIG. 17. It should be noted that for illustrative reasons, the anode electrode 18 is not shown in FIG. 17.

In this diode 2, as in the diode 5, the anode electrode 18 is in contact with the intermediate withstand voltage portion 28, the narrow groove withstand voltage portions $25_1$ to $25_3$ and the epitaxial layer 12, but not in contact with the innermost outer withstand voltage portion $27_1$ and the outermost outer withstand voltage portion $27_2$.

Different from the diode 5, relay diffusion layers 52c and 52d both made of shallow P-type impurity diffusion layers which is the same conductivity type to the intermediate withstand voltage portion and the outer withstand voltage portion, are provided at the surface of the epitaxial layer 12 between the intermediate withstand voltage portion 28 and the innermost outer withstand voltage portion $27_1$, and between the adjacent outer withstand voltage portions $27_1$ and $27_2$. Here, the relay diffusion layers 52c and 52d are arranged in direct contact to the inner ring circumference of the outer withstand voltage portions $27_1$ and $27_2$.

With this diode 2, when the PN junctions between the narrow groove withstand voltage portions $25_1$ to $25_3$ and the intermediate withstand voltage portion 28 and the epitaxial layer 12 are reverse biased, a voltage is applied directly from the anode electrode 18 to the intermediate withstand voltage portion 28 and the narrow groove withstand voltage portion $25_1$ to $25_3$ at the areas between the intermediate withstand voltage portion 28 and the narrow groove withstand voltage portions $25_1$ to $25_3$, so that depletion layers spread reliably from the intermediate withstand voltage portion 28 and the narrow groove withstand voltage portions $25_1$ to $25_3$. The depletion layers spreading from the intermediate withstand voltage portion 28 spread in inward direction as well as in outward direction, and the outwardly spreading depletion layer spreads toward the innermost outer withstand voltage portion $27_1$.

In the portions where the relay diffusion layers 52c are provided, the width of the epitaxial layer 12 without the relay diffusion layers 52c between the intermediate withstand voltage portion 28 and the innermost outer withstand voltage portion $27_1$ is smaller than in the portions where the relay diffusion layers 52c are not provided.

Therefore, the portions in which the width of the epitaxial layer 12 is smaller are depleted faster than the portions with greater widths, so that the portions where the relay diffusion layers 52c are provided are depleted at a voltage that is lower than the voltage depleting the portions where the relay diffusion layers 52c are not provided.

Consequently, the innermost outer withstand voltage portion $27_1$ and the intermediate withstand voltage portion 28 are connected through the depleted epitaxial layer 12 and the relay diffusion layers 52c, and the innermost outer voltage portion $27_1$ is no longer at floating potential. Therefore, the potential of the innermost outer withstand voltage portion $27_1$ is stabilized with a voltage that is lower than the voltage necessary to deplete those portions of the epitaxial layer 12 between the innermost outer withstand voltage portion $27_1$ and the intermediate voltage portion 28 where no relay diffusion layers 52c is provided. As a result, the spreading of the depletion layer spreading from the innermost outer withstand voltage portion $27_1$ is stabilized. The depletion layer spreading from the innermost outer withstand voltage portion $27_1$ spreads in outward direction as well as in inward direction, and the depletion layer spreading in outward direction spreads toward the outermost outer withstand voltage portion $27_2$ adjacent to the innermost outer withstand voltage portion $27_1$.

Same as the epitaxial layer 12 between the intermediate withstand voltage portion 28 and the innermost outer withstand voltage portion $27_1$ as described above, those portions of the epitaxial layer 12 between the innermost outer withstand voltage portion $27_1$ and the outermost outer withstand voltage portion $27_2$ adjacent each other where the relay diffusion layers 52d are provided are depleted at a voltage that is lower than the voltage depleting the portions where the relay diffusion layers 52d are not provided.

The relay diffusion layers 52c and 52d may be arranged between the outer withstand voltage portions $27_1$ and $27_2$, which are both at floating potential, and between the intermediate withstand voltage portion 28, which is connected to the anode electrode 18 and thus at a fixed potential, and the innermost outer withstand voltage portion $27_1$, which is at floating potential.

In the above-described diode 2, the anode electrode 18 is arranged so that it is in contact with the intermediate withstand voltage portion 28. If the anode electrode 18 of the above-described diode 2 is arranged so that it is not in contact with the intermediate withstand voltage portion 28, the intermediate withstand voltage portion 28 is at floating potential so that its potential does not settle. Then, applying a voltage to the anode electrode 18, the depletion layer spreading from the intermediate withstand voltage portion 28 to the narrow groove withstand voltage portions $25_1$ to $25_3$ becomes unstable.

In this case, the relay diffusion layers having same conductivity type to the intermediate withstand voltage portion and the outer withstand voltage portion, may be arranged not only between the outer withstand voltage portions $27_1$ and $27_2$, which are both at floating potential, and between the intermediate withstand voltage portion 28 and the innermost outer withstand voltage portion $27_1$, which are both at floating potential, but also between the intermediate withstand voltage portion 28, which is at floating potential, and the narrow groove withstand voltage portions $25_1$ to $25_3$, which are connected to the anode electrode 18 and thus at a fixed potential. In the structure having the relay diffusion layer comparing to the structure without the relay diffusion layer, the depletion layer between the intermediate withstand voltage portion 28 and the narrow groove withstand voltage portions $25_1$ to $25_3$, reaches at a low voltage, and the potential of the intermediate withstand voltage portion 28 is stabilized.

A relay diffusion layer may be arranged between diffusion layers that are both at floating potential or between a diffusion layer with fixed potential and a diffusion layer put to floating potential.

In the diode 2 having a structure as shown in FIGS. 17 and 18, a plurality of relay diffusion layers were arranged in the part of around the inner ring circumference of the outer withstand voltage portions, but the relay diffusion layers are not limited to this structure, and it is also possible to arrange a relay diffusion layer around the entire inner ring circumference or outer ring circumference.

The above-described diode 2 has been explained for the case that two outer withstand voltage portions $27_1$ and $27_2$ are provided, but it is also possible to provide only one or three or more outer withstand voltage portions. In that case, if there is only one portion in which no relay diffusion layer 52 is arranged between adjacent outer withstand voltage portions, the depletion layer may break off at this portion and breakdown may occur, but if the relay diffusion layer is arranged between all adjacent outer withstand voltage portions, all outer withstand voltage portions 27, from the innermost outer withstand voltage portion 27 to the outermost withstand voltage portion 27, are connected by depletion layers, so that no breakdown occurs at intermediate locations.

Furthermore, in the above-described diode 2, the relay diffusion layers 52c and 52d are arranged such that they are in contact with the inner ring circumference of the outer withstand voltage portions $27_1$ and $27_2$ that are at floating potential, but it is sufficient if the relay diffusion layers 52c and 52d are arranged between a diffusion layer with fixed potential and a diffusion layer arranged on the outer side thereof and at floating potential. The relay diffusion layers may be arranged such that they contact the outer ring circumference of the diffusion layer with fixed potential, or may be arranged between those adjacent diffusion layers without contacting their inner or outer circumferences.

Furthermore, in the above-described embodiment, the anode electrode 18 contacts the intermediate withstand voltage portion 28, but the present invention is not limited to this, and it is also possible to comprise a diode 3 that is similar to the structure of the diode 5 except that the anode electrode 18 is not in contact with the surface of the epitaxial layer 12 between the narrow groove withstand voltage portions $25_1$ to $25_3$ and the intermediate withstand voltage portion 28, as shown in the plan view of FIG. 19 and in FIG. 20, which is a cross-sectional view along the line G—G in FIG. 19. It should be noted that for illustrative reasons, the anode electrode 18 is not shown in FIG. 19.

With this structure, no Schottky junction is formed at the epitaxial layer 12 between the narrow groove withstand voltage portions $25_1$ to $25_3$ and the intermediate withstand voltage portion 28, so that different to diode 5, there is no depletion layer spreading in the depth direction of the epitaxial layer 12 from the Schottky junction in the epitaxial layer 12 between the intermediate withstand voltage portion 28 and the long sides of the narrow groove withstand voltage portions $25_1$ to $25_3$. In the diode 3, depletion layers spread in lateral direction from the inner ring circumference of the intermediate withstand voltage portion 28 and the narrow groove withstand voltage portions $25_1$ to $25_3$, as in the diode 5, when the epitaxial layer 12 is depleted between the inner ring circumference of the intermediate withstand voltage portion 28 and the long sides of the narrow groove withstand voltage portions $25_1$ to $25_3$ by the due to these depletion layer. The epitaxial layer 12 between the inner ring circumference of the intermediate withstand voltage portion 28 and the short sides of the narrow groove withstand voltage portions $25_1$ to $25_3$ and the epitaxial layer 12 between the innermost outer withstand voltage portion $27_1$ and the outer ring circumference of the intermediate withstand voltage portion 28 are depleted as in the diode 5, so that all of the epitaxial layer 12 on the inner side of the innermost outer withstand voltage portion $27_1$ becomes depleted.

Furthermore, in the foregoing explanations, the first conductivity type was N and the second conductivity type was P, but it is also possible that the first conductivity type is P and the second conductivity type is N.

As explained above, it is possible to attain a diode with high withstand voltage and without electric field concentrations.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description. All changes that come within the meaning and range of equivalency of the claims are intended to be embraced therein.

What is claimed is:

1. A diode element, comprising:

a substrate of a first conductivity type;

a plurality of grooves formed in a main surface of the substrate;

a semiconductor filler that is made of a semiconductor of a second conductivity type, which is opposite to the first conductivity type, filled into the grooves; and an electrode film arranged on the main surface;

wherein a Schottky junction is formed at a portion where the electrode film contacts surface of the substrate, and an ohmic junction is formed at a portion where the electrode film contacts surface of the semiconductor filler;

wherein the grooves comprise a first narrow groove ring, whose planar shape is a ring and whose inner circumference is quadrilateral, and a plurality of rectangular narrow grooves, whose planar shape is that of an narrow rectangle, which are arranged at positions on the inner side of the inner ring circumference of the first narrow groove ring, and four sides of the rectangular narrow groove are arranged parallel to the inner ring circumference of the first narrow groove ring;

wherein one intermediate withstand voltage portion and a plurality of narrow groove withstand voltage portion are comprised by the semiconductor filler filled into the first narrow groove ring and the rectangular narrow grooves;

wherein the surface of the narrow groove withstand voltage portions and the substrate surface between the narrow groove withstand voltage portions is in contact with the electrode film; and wherein the distance a between the long sides of the narrow groove withstand voltage portions opposing to the inner ring circumference of the intermediate withstand voltage portion and the inner ring circumference of the intermediate withstand voltage portion is set to substantially twice the distance b between the short sides of the narrow groove withstand voltage portions and the inner ring circumference of the intermediate withstand voltage portion.

2. The diode element according to claim 1, wherein the intermediate withstand voltage portion does not contact the electrode film and is at floating potential.

3. The diode element according to claim 1,
wherein the grooves further comprise a ring-shaped second narrow groove ring enclosing the first narrow groove ring;
wherein an outer withstand voltage portion is comprised the semiconductor filler filled into the second narrow groove ring;
wherein the intermediate withstand voltage portion contacts the electrode film; and
wherein the outer withstand voltage portion does not contact the electrode film and is at floating potential.

4. The diode element according to claim 1,
comprising a plurality of narrow groove withstand voltage portions;
wherein the narrow groove withstand voltage portions are arranged in parallel to one another at a distance d between the long sides of the narrow groove withstand voltage portions; and
wherein the distance d is substantially the same as the distance a between the long sides of the narrow groove withstand voltage portions opposing to the inner ring circumference of the intermediate withstand voltage portion and the inner ring circumference of the intermediate withstand voltage portion.

5. The diode element according to claim 3, wherein a ring width w of the outer withstand voltage portion and the intermediate withstand voltage portion is substantially the same as a width y of the rectangular narrow grooves, and a distance c between the inner ring circumference of the outer withstand voltage portions and the outer ring circumference of the intermediate withstand voltage portion is substantially the same as the distance a between the long sides of the narrow groove withstand voltage portions opposing to the inner ring circumference of the intermediate withstand voltage portion and the inner ring circumference of the intermediate withstand voltage portion.

6. The diode element according to claim 4, wherein a ring width w of the outer withstand voltage portion and the intermediate withstand voltage portion is substantially the same as a width y of the rectangular narrow grooves, and a distance c between the inner ring circumference of the outer withstand voltage portions and the outer ring circumference of the intermediate withstand voltage portion is substantially the same as the distance a between the long sides of the narrow groove withstand voltage portions opposing to the inner ring circumference of the intermediate withstand voltage portion and the inner ring circumference of the intermediate withstand voltage portion.

* * * * *